US010224306B2

(12) United States Patent
Auchere et al.

(10) Patent No.: US 10,224,306 B2
(45) Date of Patent: Mar. 5, 2019

(54) METHOD FOR FORMING AN ELECTRICAL CONNECTION BETWEEN AN ELECTRONIC CHIP AND A CARRIER SUBSTRATE AND ELECTRONIC DEVICE

(71) Applicant: STMicroelectronics (Grenoble 2) SAS, Grenoble (FR)

(72) Inventors: David Auchere, Meylan (FR); Asma Hajji, Rives (FR); Fabien Quercia, Saint Marcelin (FR); Jerome Lopez, Saint-Joseph-de-Riviere (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/602,278

(22) Filed: May 23, 2017

(65) Prior Publication Data

US 2018/0122770 A1     May 3, 2018

(30) Foreign Application Priority Data

Nov. 3, 2016 (FR) ..................... 16 60622
Nov. 3, 2016 (FR) ..................... 16 60623
Nov. 3, 2016 (FR) ..................... 16 60624

(51) Int. Cl.
*H01L 23/552* (2006.01)
*H01L 23/00* (2006.01)
*H01L 23/31* (2006.01)

(52) U.S. Cl.
CPC .......... *H01L 24/85* (2013.01); *H01L 23/3157* (2013.01); *H01L 23/552* (2013.01); *H01L 24/48* (2013.01); *H01L 2224/48992* (2013.01); *H01L 2224/48997* (2013.01); *H01L 2224/8592* (2013.01)

(58) Field of Classification Search
CPC .... H01L 23/3157; H01L 23/552; H01L 24/85
See application file for complete search history.

(56) References Cited

U.S. PATENT DOCUMENTS 6,084,295 A    7/2000   Horiuchi et al.
8,377,749 B1   2/2013   Patterson
(Continued)

FOREIGN PATENT DOCUMENTS

DE         2514011 A1    10/1976
JP          H01248547 A   10/1989
JP          H06268100 A   9/1994
(Continued)

OTHER PUBLICATIONS

INPI Search Report and Written Opinion for FR 1660623 dated Jul. 21, 2017 (8 pages).

(Continued)

*Primary Examiner* — Trang Q Tran
(74) *Attorney, Agent, or Firm* — Crowe & Dunlevy

(57) ABSTRACT

An electrical connection wire connects an electrical connection pad of an electrical chip and an electrical connection pad of a carrier substrate to which the electronic chip is mounted. A dielectric layer surrounds at least the bonding wire. The dielectric layer may be a dielectric sheath or a hardened liquid dielectric material. A dielectric material may also cover at least a portion of the electrical chip and carrier substrate. A liquid electrically conductive material is deposited and hardened to form a local conductive shield surrounding the dielectric layer at the bonding wire.

6 Claims, 10 Drawing Sheets

(56) References Cited

U.S. PATENT DOCUMENTS

2006/0097404 A1    5/2006   Cho et al.
2010/0025864 A1    2/2010   Bailey et al.

FOREIGN PATENT DOCUMENTS

| JP | 2000058579 A | 2/2000 |
| JP | 2000286367 A | 10/2000 |
| JP | 2002064166 A | 2/2002 |
| JP | 2013197531 A | 9/2013 |

OTHER PUBLICATIONS

INPI Search Report and Written Opinion for FR 1660622 dated Jul. 21, 2017 (14 pages).
INPI Search Report and Written Opinion for FR 1660624 dated Jul. 21, 2017 (13 pages).
Cahill, Sean S., et al: "Development of 100+ GHz High-frequency MicroCoax Wire Bonds," IMAPS 2006, http://processsolutionsconsulting.com/pdf/Reliability/Cahill_IMAPS2006_paper.pdf (8 pages).

METHOD FOR FORMING AN ELECTRICAL CONNECTION BETWEEN AN ELECTRONIC CHIP AND A CARRIER SUBSTRATE AND ELECTRONIC DEVICE

PRIORITY CLAIM

This application claims the priority benefit of French Application for Patent Nos. 1660622, 1660623, and 1660624, all filed on Nov. 3, 2016, the disclosures of which are hereby incorporated by reference in their entirety.

TECHNICAL FIELD

Embodiments relate to the field of electronic devices and, more particularly, to those which comprise electronic chips mounted on carrier substrates, including electrical connection networks or lead frames, and electrical connection wires which connect the chips to the carrier substrates.

BACKGROUND

In the case in which electrical connection wires convey signals, in particular at high frequencies, these signals may be attenuated or disrupted by surrounding electromagnetic fields and/or emit electromagnetic fields which may disrupt the surroundings.

Currently, in order to manage this issue, it is proposed to add metal shielding plates, which are potentially connected to a ground, to electronic devices. Nonetheless, positioning such metal shielding plates and electrically connecting them to a ground, combined with producing encapsulation blocks or putting encapsulation lids into place, poses problems and is costly. Moreover, since the shielding obtained is non-specific and located some distance away from the electrical connection wires, the level of electromagnetic protection obtained remains inadequate.

SUMMARY

According to one embodiment, a method is proposed for forming an electrical connection between an electronic chip and a carrier substrate on which this chip is mounted.

The method comprises the following steps: placing an electrical connection wire between an exposed electrical connection pad of the electronic chip and an exposed electrical connection pad of the carrier substrate and forming electrical junctions between the ends of this wire and the pads; producing a local dielectric coating made of a dielectric material, which at least partially surrounds the electrical connection wire and at least partially covers the pads and the junctions; and producing a local conductive shield made of an electrically conductive material, which at least partially covers said local dielectric coating.

The local dielectric coating may be obtained by distributing a determined amount of the dielectric material in the liquid state and hardening this dielectric material.

The local conductive shield may be obtained by distributing a determined amount of an electrically conductive material in the liquid state and hardening this conductive material.

The distributing may be achieved by means of a controlled tool comprising a dispensing syringe.

The local dielectric coating may completely surround the electrical connection wire and completely covers the pads and the junctions and the local conductive shield may completely cover said local dielectric coating.

The local dielectric coating may be produced so as to completely surround the electrical connection wire and completely cover the pads and the junctions, and the local conductive shield may be produced so as to completely cover the local dielectric coating.

The method may additionally comprise the following steps: placing an additional electrical connection wire between an exposed electrical connection pad of the electronic chip and an exposed electrical connection pad of the carrier substrate and forming electrical junctions between the ends of this additional electrical connection wire and these pads; and producing the local conductive shield such that this local conductive shield makes contact with this additional electrical connection wire and/or with at least one of these electrical connection pads.

An electronic device is also proposed which comprises: a carrier substrate; an electronic chip mounted on the carrier substrate; at least one electrical connection wire connecting an electrical connection pad of the carrier substrate and an electrical connection pad of the electronic chip; a local dielectric coating made of a dielectric material at least partially surrounding the electrical connection wire and at least partially covering the electrical connection pads; and a local conductive shield made of an electrically conductive material at least partially covering the local dielectric coating.

The local dielectric coating made of a dielectric material may completely surround the electrical connection wire and may completely cover the pads and the junctions, and the local conductive shield may completely cover said local dielectric coating.

The device may additionally comprise at least one additional electrical connection wire connecting an electrical connection pad of the carrier substrate and an electrical connection pad of the electronic chip, the local conductive shield making contact with this additional electrical connection wire and/or with at least one of these electrical connection pads.

According to one embodiment, a method is proposed for forming an electrical connection between an electronic chip and a carrier substrate on which this chip is mounted.

The method comprises the following steps: placing an electrical connection wire between an exposed electrical connection pad of the electronic chip and an exposed electrical connection pad of the carrier substrate and forming electrical junctions between the ends of the electrical connection wire and the pads, the electrical connection wire being equipped with an insulating sheath made of a dielectric material which surrounds it; producing a local dielectric coating made of a dielectric material, which at least partially covers at least one of the pads and the adjacent junction and at least partially surrounds an adjacent end portion of the insulating sheath; and producing a local conductive shield made of an electrically conductive material, which at least partially covers said dielectric coating and at least partially surrounds the insulating sheath.

The local dielectric coating may be obtained by distributing a determined amount of the dielectric material in the liquid state and hardening this dielectric material.

The conductive shield may be obtained by distributing a determined amount of an electrically conductive material in the liquid state and hardening this conductive material.

The distributing may be achieved by means of a controlled tool comprising a dispensing syringe.

The local dielectric coating may be produced so as to have a first local dielectric coating and a second local dielectric coating which cover the pads and the adjacent junctions and surround the adjacent end portions of the insulating sheath, respectively, and the local conductive shield may be produced so as to cover the local dielectric coating and to surround the insulating sheath.

The method may additionally comprise the following steps: placing an additional electrical connection wire between an exposed electrical connection pad of the electronic chip and an exposed electrical connection pad of the carrier substrate and forming electrical junctions between the ends of this additional electrical connection wire and these pads; and producing the local conductive shield such that this local conductive shield makes contact with this additional electrical connection wire and/or with at least one of these electrical connection pads.

An electronic device is also proposed which comprises: a carrier substrate; an electronic chip mounted on the carrier substrate; at least one electrical connection wire connecting an electrical connection pad of the carrier substrate and an electrical connection pad of the electronic chip, this electrical connection wire being equipped with an insulating sheath made of a dielectric material which surrounds it; a local dielectric coating made of a dielectric material at least partially covering at least one of the electrical connection pads and at least partially surrounding at least one adjacent end of the insulating sheath; and a local conductive shield made of an electrically conductive material at least partially covering the dielectric coating.

The local dielectric coating may be produced so as to have a first local dielectric coating and a second local dielectric coating which completely cover the pads and the adjacent junctions and completely surround the adjacent end portions of the insulating sheath, respectively, and the local conductive shield may completely cover the dielectric coating and surrounds the insulating sheath.

The device may comprise at least one additional electrical connection wire connecting an electrical connection pad of the carrier substrate and an electrical connection pad of the electronic chip, the local conductive shield making contact with this additional electrical connection wire and/or with at least one of these electrical connection pads.

According to one embodiment, a method is proposed for forming an electrical connection between an electronic chip and a carrier substrate on which this chip is mounted.

The method comprises the following steps: placing at least one electrical connection wire between an exposed electrical connection pad of the chip and an exposed electrical connection pad of the carrier substrate and forming electrical junctions between the ends of the wire and the pads; producing a dielectric layer made of a dielectric material on top of a zone of the electronic chip and of the carrier substrate, including the electrical connection wire, the junctions and the pads, such that this dielectric layer forms a local dielectric coating which at least partially surrounds the electrical connection wire and at least partially covers the junctions and the pads; and producing a local conductive shield made of an electrically conductive material which at least partially covers the local dielectric coating.

The dielectric layer including the local dielectric coating may be obtained by distributing a determined amount of the dielectric material in the liquid state and hardening this dielectric material.

The dielectric material may be distributed by means of sputtering.

The local conductive shield may be obtained by distributing a determined amount of an electrically conductive material in the liquid state and hardening this conductive material.

The conductive material may be distributed by means of a controlled tool comprising a dispensing syringe.

The local dielectric coating may be produced so as to completely surround the electrical connection wire and to completely cover the pads and the junctions and the local conductive shield may be produced so as to completely cover said local dielectric coating.

The method may additionally comprise the following steps: producing openings in the dielectric layer above additional electrical connection pads of the electronic chip and of the carrier substrate; placing an additional electrical connection wire between the additional pads and forming electrical junctions between the ends of the additional wire and additional pads; and producing the local conductive shield such that this local conductive shield makes contact with the additional electrical connection wire and/or with at least one of the additional pads.

An electronic device is also proposed which comprises: a carrier substrate; an electronic chip mounted on the carrier substrate; at least one electrical connection wire connecting an electrical connection pad of the carrier substrate and an electrical connection pad of the electronic chip; a dielectric layer made of a dielectric material on top of a zone of the electronic chip and of the carrier substrate, including the electrical connection wire, the junctions and the pads, such that this dielectric material forms a local dielectric coating which at least partially surrounds the electrical connection wire and at least partially covers the junctions and the pads; and a local conductive shield made of an electrically conductive material at least partially covering the local dielectric coating.

The local dielectric coating may completely surround the electrical connection wire and completely cover the pads and the junctions and the local conductive shield may completely cover the local dielectric coating.

The device may comprise at least one additional electrical connection wire connecting an electrical connection pad of the carrier substrate and an electrical connection pad of the electronic chip, the local conductive shield making contact with the additional electrical connection wire and/or with at least one of these electrical connection pads.

BRIEF DESCRIPTION OF THE DRAWINGS

An electronic device and a mode of fabrication will now be described by way of non-limiting examples, which are illustrated by the appended drawings in which.

DETAILED DESCRIPTION

Figure 1:
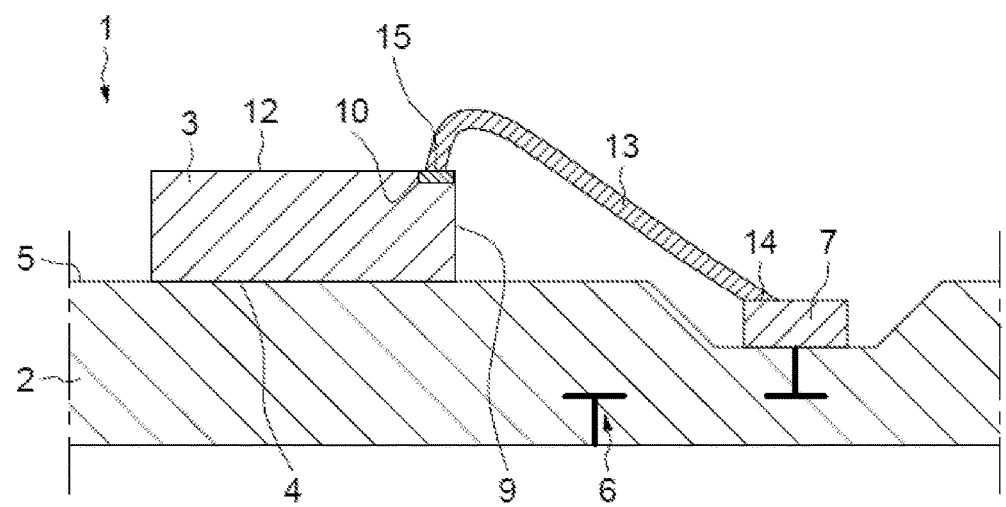
FIG. 1 represents a cross-sectional view of an electronic device during manufacture, in one manufacturing step.
Figure 2:
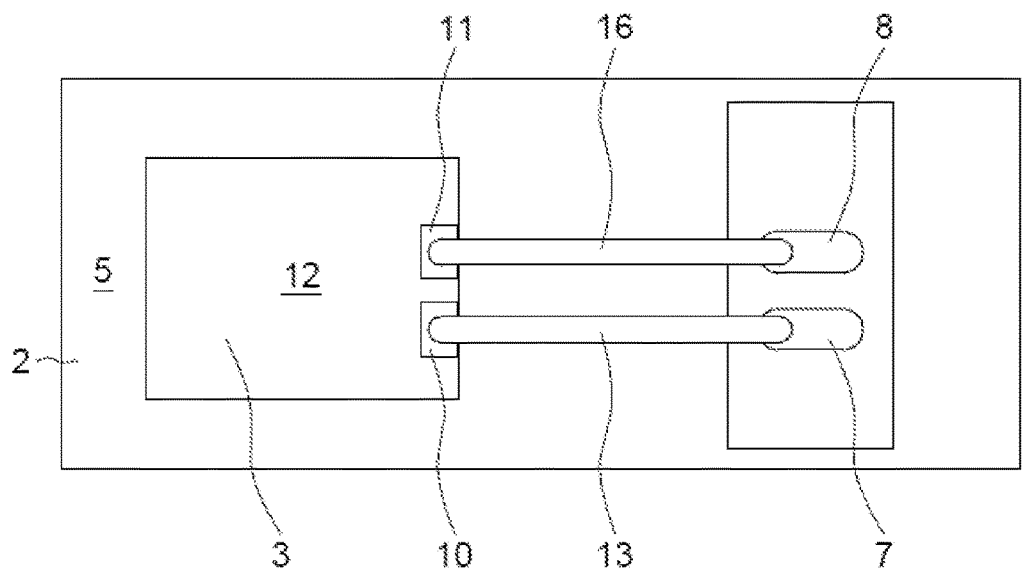
FIG. 2 represents a view from above of the electronic device of FIG. 1.

As illustrated in FIGS. 1 and 2, an electronic device 1 comprises a carrier substrate 2 and an electronic chip 3, including integrated circuits, a back face 4 of which is fixed to a front face 5 of the carrier substrate 2 by means of a layer of adhesive (not shown).

The carrier substrate 2 is made of a dielectric material and includes an integrated electrical connection network 6, for connecting to one or more metal levels, which comprises front exposed electrical connection pads 7 and 8 of the front face 5 which are located laterally at a distance from a flank 9 of the electronic chip 3 and in proximity of one another.

The electronic chip 3 comprises front exposed electrical connection pads 10 and 11 of a front face 12 of this electronic chip 3, opposite its back face 4, which are located at a distance from the flank 9 of the electronic chip 3, not far from the front pads 7 and 8 of the carrier substrate 2.

Steps for the purpose of forming electrical connections between the pads 7 and 10 and, optionally, the pads 8 and 11, of the carrier substrate 2 and the electronic chip 3, respectively, will now be described.

In a step illustrated in FIGS. 1 and 2, on the one hand a bare electrical connection wire (also referred to as a bonding wire) 13 is put into place between the exposed electrical connection pads 7 and 10, and electrical junctions 14 and 15 are formed, by means of soldering, between the ends of the electrical connection wire 13 and the pads 7 and 10, respectively, and, on the other hand, an additional electrical connection wire 16 is put into place between the additional exposed electrical connection pads 8 and 11, and electrical junctions are formed, by means of soldering, between the end portions of the electrical connection wire 16 and the pads 8 and 11, respectively. The electrical connection wires 13 and 16 are neighboring but at a distance from one another.

This operation of putting the electrical connection wires 13 and 16 into place may be carried out using a specialized wire-bonding machine.

Figure 3:
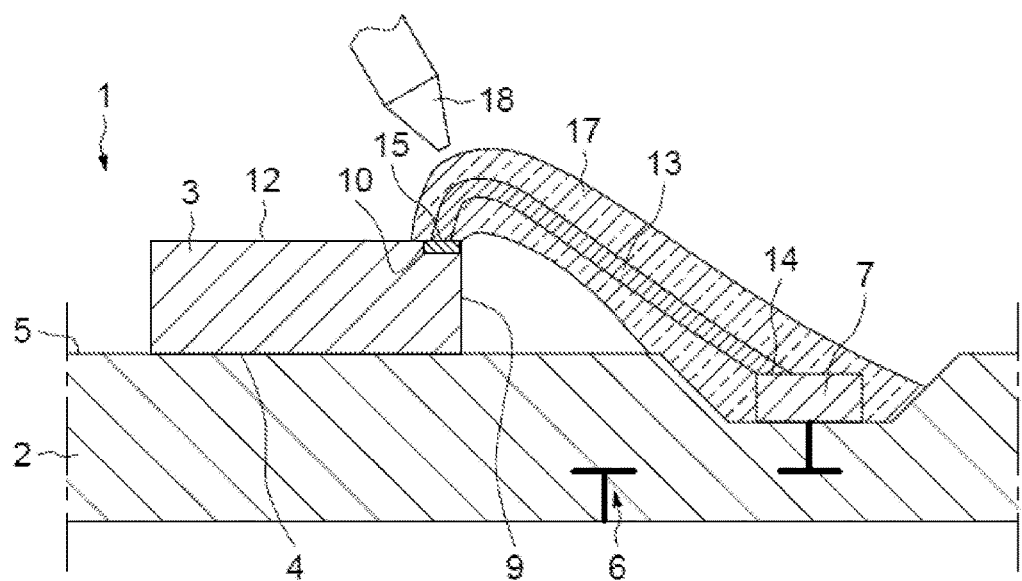
FIG. 3 represents a cross-sectional view of the electronic device during manufacture, in a later manufacturing step.
Figure 4:
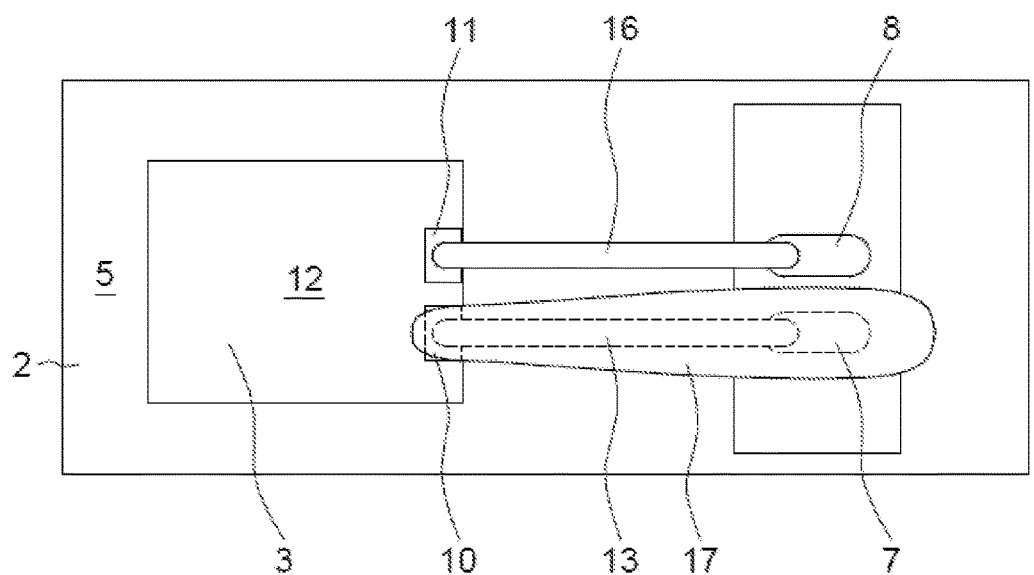
FIG. 4 represents a view from above of the electronic device of FIG. 3.

In a later step illustrated in FIGS. 3 and 4, a determined amount of an adhesive liquid dielectric material is locally distributed on top of the electrical wire 13, such that this dielectric material completely surrounds the electrical connection wire 13 and completely covers the pads 7 and 10 and the junctions 14 and 15. After hardening, this dielectric material forms a local dielectric coating 17.

This operation may be carried out, for example, using a specialized tool comprising a dispensing syringe 18 capable of delivering at least one calibrated drop of the liquid dielectric material on top of the electrical connection wire 13, this liquid dielectric material flowing ultimately to surround the electrical connection wire 12 and to cover the pads 7 and 10 and the junctions 14 and 15, in particular by means of wetting or capillary effect.

Next, the liquid dielectric material is hardened in order to form the dielectric coating 17, either by virtue of its intrinsic hardening qualities at room temperature or by hardening under the effect of a heat source or a source of light radiation. For example, the dielectric material may be a suitable epoxy resin.

Figure 5:
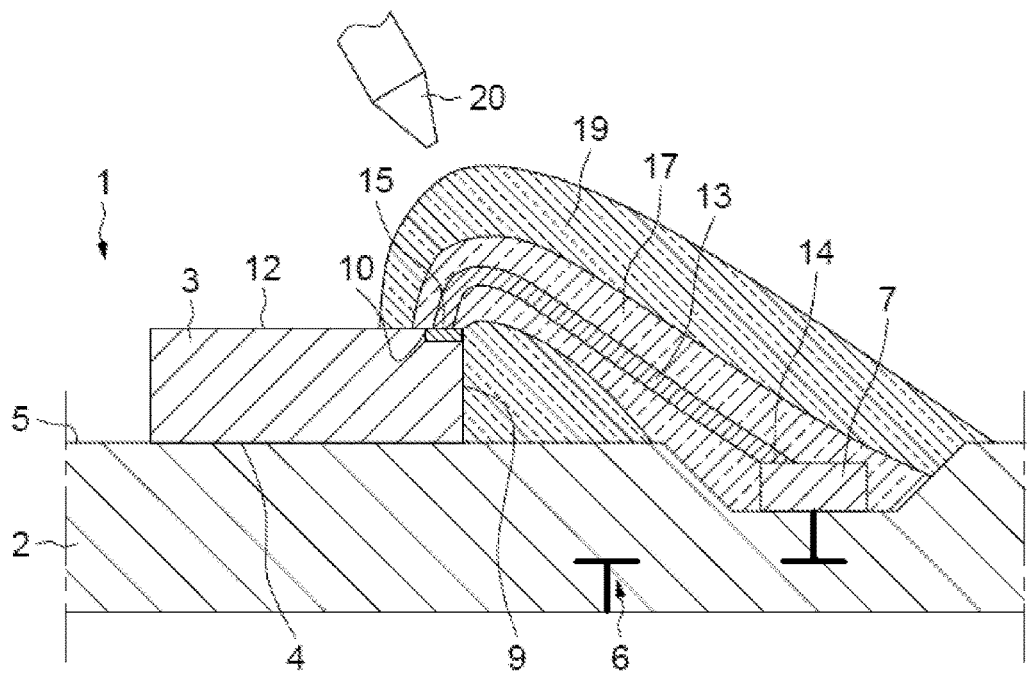
FIG. 5 represents a cross-sectional view of the electronic device during manufacture, in a later manufacturing step, showing the electronic device obtained.
Figure 6:
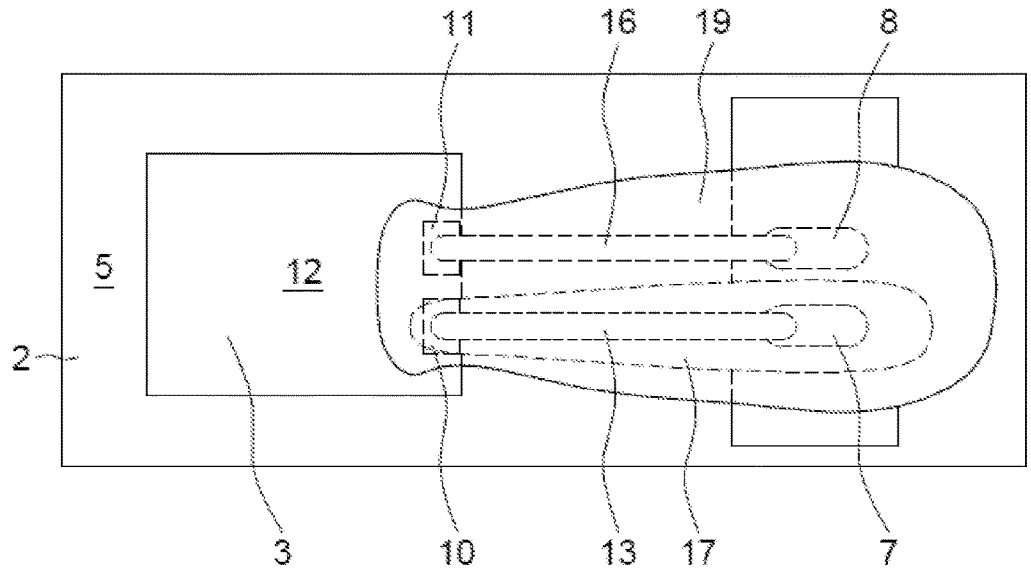
FIG. 6 represents a view from above of the electronic device of FIG. 5.

In a later step illustrated in FIGS. 5 and 6, a determined amount of an electrically conductive adhesive liquid material is locally distributed on top of the dielectric coating 17 and potentially on top of the electrical connection wire 16 such that this conductive material completely surrounds the dielectric coating 17 and makes contact with the electrical connection wire 16 and/or the pads 8 and 11, this conductive material potentially overflowing onto the front faces 5 and 12 of the carrier substrate 2 and of the electronic chip 3. After hardening, this conductive material forms a local electrically conductive shield 19 which is as close as possible to the electrical connection wire 13 and is connected to the electrical connection wire 16 and to the pads 8 and 11.

This operation may be carried out, for example, using a specialized controlled tool comprising a dispensing syringe 20, capable of delivering at least one calibrated drop of the liquid conductive material, this liquid conductive material flowing in particular by means of wetting or capillary effect.

Next, the liquid conductive material is hardened in order to form the local conductive shield 19, by virtue of its intrinsic hardening qualities at room temperature or by hardening under the effect of a heat source or a source of light radiation. For example, the conductive material may be an epoxy resin filled with metal particles.

The finished electronic device 1 is thus obtained.

The electrical connection wire 13 is intended to convey electrical signals between the pads 7 and 10 of the carrier substrate 2 and the electronic chip 3. The conductive shield 19 provides electromagnetic protection for these electrical signals.

The pads 8 and 11, which are connected by the electrical connection wire 16, form ground pads of the electrical circuits of the electronic device 1. Thus, the conductive shield 19, which is connected to the pads 8 and 11 and to the electrical connection wire 16, is connected to the ground of the electrical circuits of the electronic device 1.

According to one variant embodiment, it would be possible for the local dielectric coating 17 to cover only one of the pads 7 and 10 and an adjacent portion of the electrical connection wire 13 and it would be possible for the local conductive shield 19 to partially cover this reduced local dielectric coating 17 without this reduced local conductive shield 19 coming into contact with the electrical connection wire 13.

According to one variant embodiment, it would be possible to do omit the electrical connection wire 16.

Of course, the electronic device 1 may comprise other electrical connection wires 13 connecting other pads 7 and 10 of the carrier substrate 2 and of the electronic chip 3, and other electrical connection wires 16 connecting other pads 8 and 11 of the carrier substrate 2 and of the electronic chip 3, which are also equipped with local dielectric coatings 17 and local conductive shields 19, the respective steps of the production of which would be the same.

According to one variant embodiment, it would be possible for one local conductive shield 19 to be shared by multiple neighboring electrical connection wires 13 and to locally cover the front face 5 of the carrier substrate and/or the front face 12 of the electronic chip 3, such that this extended local conductive shield 19 would form electromagnetic protection for some of the electronic circuits of the electronic device 1. Such an extended local conductive shield 19 could, for example, be formed by means of physical vapor deposition (PCV) of a metal material, for example copper or aluminum. In this case, it would be possible to provide a single ground electrical connection wire 16. Still in this case, and as a variant, the extended local conductive shield 19 could be connected to ground by providing at least one electrical connection pad 8 of the carrier substrate 2 that is not covered by the dielectric coating 17.

According to one variant embodiment, the carrier substrate 2 could comprise a metal frame comprising a platform upon which the electronic chip 3 would be mounted, the electrical connection wires 13 and 16 connecting the electronic chip 3 to peripheral leads of this frame.

Figure 7:
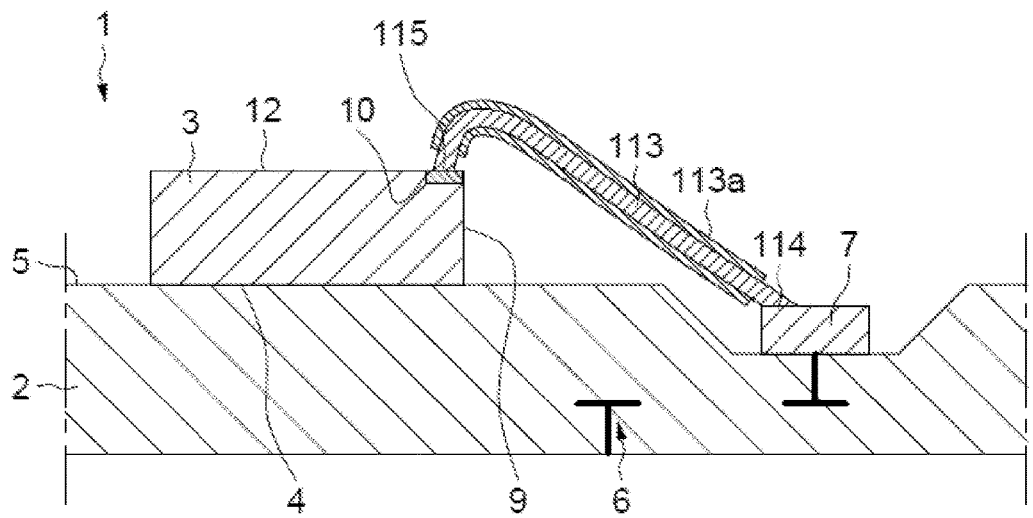
FIG. 7 represents a cross-sectional view of an electronic device during manufacture, in one manufacturing step.
Figure 8:
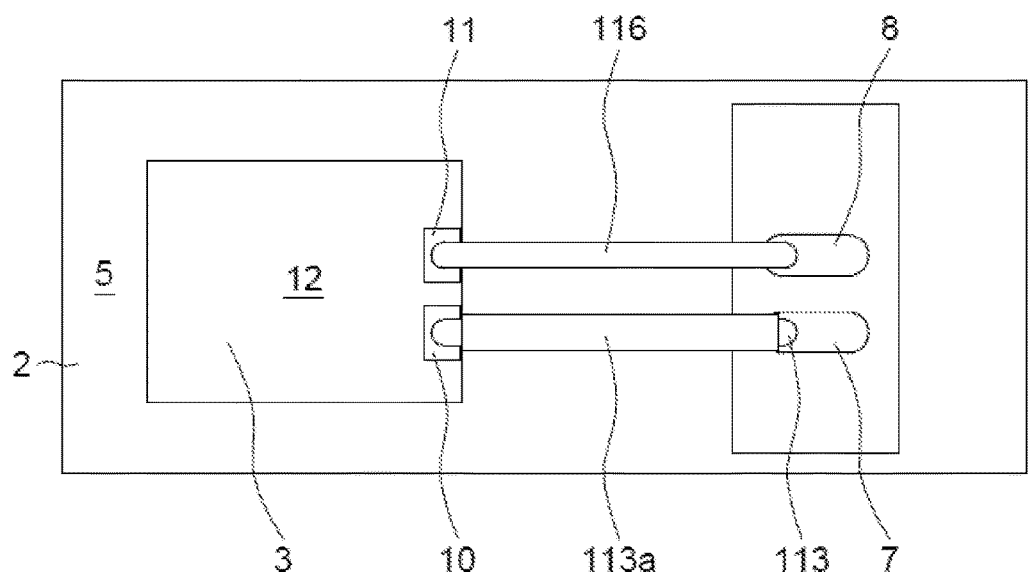
FIG. 8 represents a view from above of the electronic device of FIG. 7.

As illustrated in FIGS. 7 and 8, an electronic device 1 comprises a carrier substrate 2 and an electronic chip 3, including integrated circuits, a back face 4 of which is fixed to a front face 5 of the carrier substrate 2 by means of a layer of adhesive (not shown).

The carrier substrate 2 is made of a dielectric material and includes an integrated electrical connection network 6, for connecting to one or more metal levels, which comprises front exposed electrical connection pads 7 and 8 of the front face 5 which are located laterally at a distance from a flank 9 of the electronic chip 3 and in proximity of one another.

The electronic chip 3 comprises front exposed electrical connection pads 10 and 11 of a front face 12 of this electronic chip 3, opposite its back face 4, which are located at a distance from the flank 9 of the electronic chip 3, not far from the front pads 7 and 8 of the carrier substrate 2.

Steps for the purpose of forming electrical connections between the pads 7 and 10 and, optionally, the pads 8 and 11, of the carrier substrate 2 and the electronic chip 3, respectively, will now be described.

In a step illustrated in FIGS. 7 and 8, an electrical connection wire 113, surrounded by a sheath 113a made of a dielectric material, is put into place between the exposed electrical connection pads 7 and 10, and electrical junctions 114 and 115 are formed, by means of soldering, between the ends of the electrical connection wire 113 and the pads 7 and 10, respectively. Furthermore, an additional electrical connection wire 116, either bare or surrounded by an insulating sheath, is put into place between the additional exposed electrical connection pads 8 and 11, and electrical junctions are formed, by means of soldering, between the end portions of the electrical connection wire 116 and the pads 8 and 11, respectively. The electrical connection wires 113 and 116 are neighboring but at a distance from one another.

This operation of putting the electrical connection wires 113 and 116 into place may be carried out using a specialized wire-bonding machine.

Figure 9:
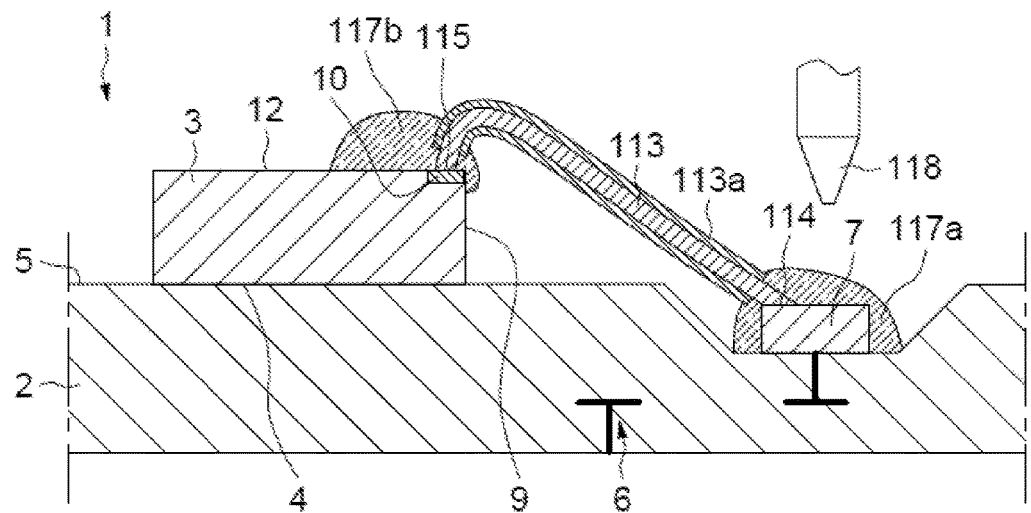
FIG. 9 represents a cross-sectional view of the electronic device during manufacture, in a later manufacturing step.
Figure 10:
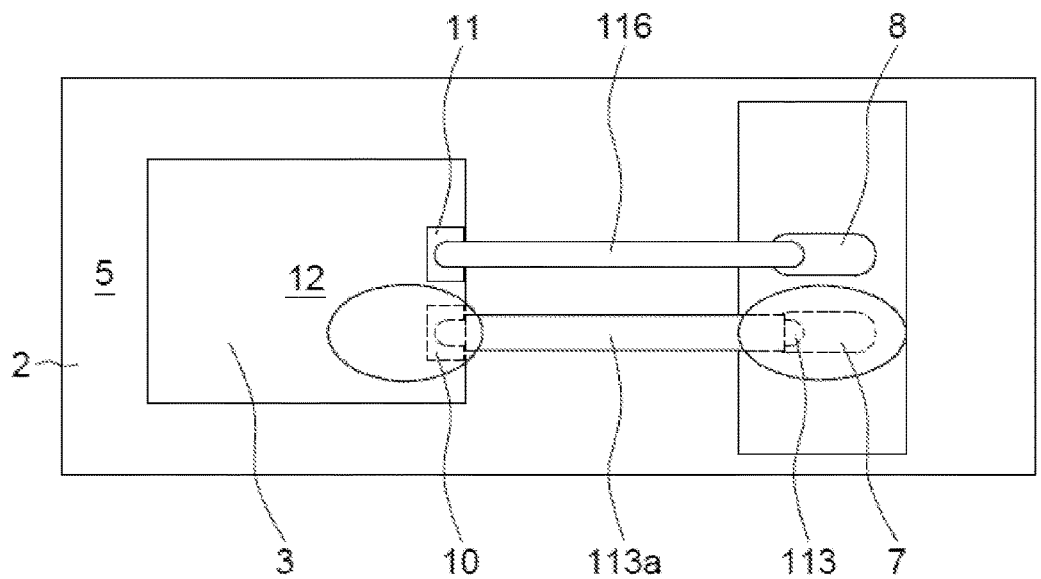
FIG. 10 represents a view from above of the electronic device of FIG. 9.

In a later step illustrated in FIGS. 9 and 10, a determined amount of an adhesive liquid dielectric material is locally distributed on top of the pad 7 and/or the junction 114 and/or the end portion of the insulating sheath 113a that is adjacent to the junction 114, such that this dielectric material completely covers the pad 7 and the junction 114 and completely surrounds the end portion of the insulating sheath 113a that is adjacent to the junction 114. After hardening, this dielectric material forms a first local dielectric coating 117a.

In an equivalent manner, a determined amount of an adhesive liquid dielectric material is locally distributed on top of the pad 10 and/or the junction 115 and/or the end portion of the insulating sheath 113a that is adjacent to the junction 115, such that this dielectric material completely covers the pad 7 and the junction 115 and completely surrounds the end portion of the insulating sheath 113a that is adjacent to the junction 115. After hardening, this dielectric material forms a second local dielectric coating 117b.

These operations may be carried out, for example, using a specialized controlled tool comprising a dispensing syringe 118 capable of delivering at least one calibrated drop of the liquid dielectric material, this liquid dielectric material flowing ultimately to cover the pads 7 and 10 and the junctions 114 and 115 and to surround the corresponding end portions of the insulating sheath 113a, in particular by means of wetting or capillary effect.

Next, the liquid dielectric material is hardened in order to form the dielectric coatings 117a and 117b, by virtue of its intrinsic hardening qualities at room temperature or by hardening under the effect of a heat source or a source of light radiation. For example, the dielectric material may be a suitable epoxy resin.

Figure 11:
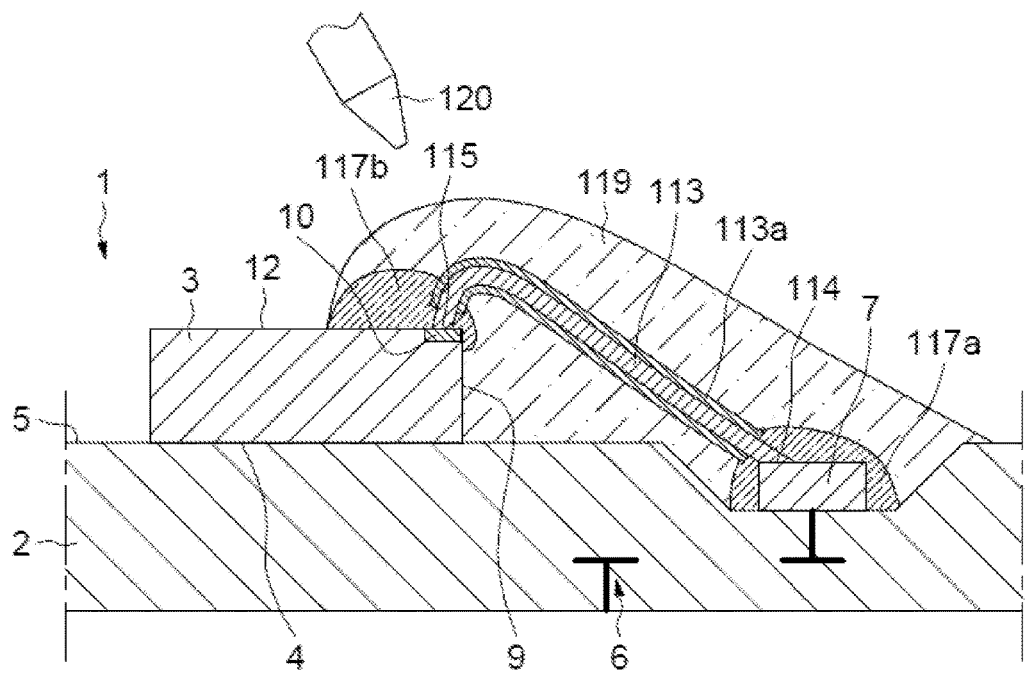
FIG. 11 represents a cross-sectional view of the electronic device during manufacture, in a later manufacturing step, showing the electronic device obtained.
Figure 12:
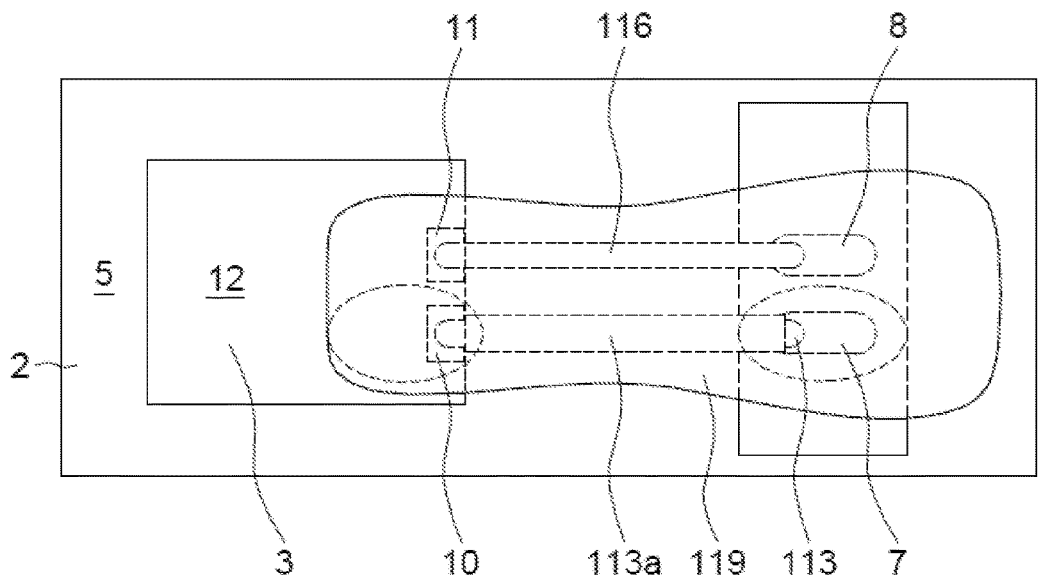
FIG. 12 represents a view from above of the electronic device of FIG. 11.

In a later step illustrated in FIGS. 11 and 12, a determined amount of an electrically conductive adhesive liquid material is locally distributed such that this conductive material completely surrounds the insulating sheath 113a, covers the local dielectric coatings 117a and 117b and makes contact with the electrical connection wire 116 and/or the pads 8 and 11, this conductive material potentially overflowing onto the front faces 5 and 12 of the carrier substrate 2 and of the electronic chip 3. After hardening, this conductive material forms a local electrically conductive shield 119 which is as close as possible to the electrical connection wire 113 and is connected to the electrical connection wire 116 and to the pads 8 and 11.

This operation may be carried out, for example, using a specialized tool comprising a dispensing syringe 120, capable of delivering at least one respective calibrated drop of the liquid conductive material, this liquid conductive material flowing in particular by means of wetting or capillary effect.

Next, the liquid conductive material is hardened in order to form the local conductive shield 119, by virtue of its intrinsic hardening qualities at room temperature or by hardening under the effect of a heat source or a source of light radiation. For example, the conductive material may be an epoxy resin filled with metal particles.

The electrical connection wire 113 is intended to convey electrical signals between the pads 7 and 10 of the carrier substrate 2 and the electronic chip 3. The conductive shield 119 provides electromagnetic protection for these electrical signals.

The pads 8 and 11, which are connected by the electrical connection wire 116, form ground pads of the electrical circuits of the electronic device 1. Thus, the conductive shield 119, which is connected to the pads 8 and 11 and to the electrical connection wire 116, is connected to the ground of the electrical circuits of the electronic device 1.

According to one variant embodiment, it would be possible to provide only one of the local dielectric coatings 117a and 117b and it would be possible for the local conductive shield 119 to partially cover this local dielectric coating and a portion of the sheath 113a without this reduced local conductive shield 119 coming into contact with the electrical connection wire 113 and the opposite pad.

According to one variant embodiment, it would be possible to do omit the electrical connection wire 116.

Of course, the electronic device 1 may comprise other electrical connection wires 113 connecting other pads 7 and 10 of the carrier substrate 2 and of the electronic chip 3, and other electrical connection wires 116 connecting other pads 8 and 11 of the carrier substrate 2 and of the electronic chip 3, which are also equipped with local dielectric coatings 117a and 117b and local conductive shields 119, the respective steps of the production of which would be the same.

According to one variant embodiment, it would be possible for one local conductive shield 119 to be shared by multiple neighboring electrical connection wires 113 and to locally cover the front face 5 of the carrier substrate and/or the front face 12 of the electronic chip 3, such that this extended local conductive shield 119 would form electromagnetic protection for some of the electronic circuits of the electronic device 1. Such an extended local conductive shield 119 could, for example, be formed by means of physical vapor deposition (PCV) of a metal material, for example copper or aluminum. In this case, it would potentially be possible to provide a single ground electrical connection wire 116. Still in this case and as a variant, the extended local conductive shield 119 could be connected to ground by providing at least one electrical connection pad 8 of the carrier substrate 2 that is not covered by the dielectric coating 117.

According to one variant embodiment, the carrier substrate 2 could comprise a metal frame comprising a platform upon which the electronic chip 3 would be mounted, the electrical connection wires 113 and 116 connecting the electronic chip 3 to peripheral leads of this frame.

Figure 13:
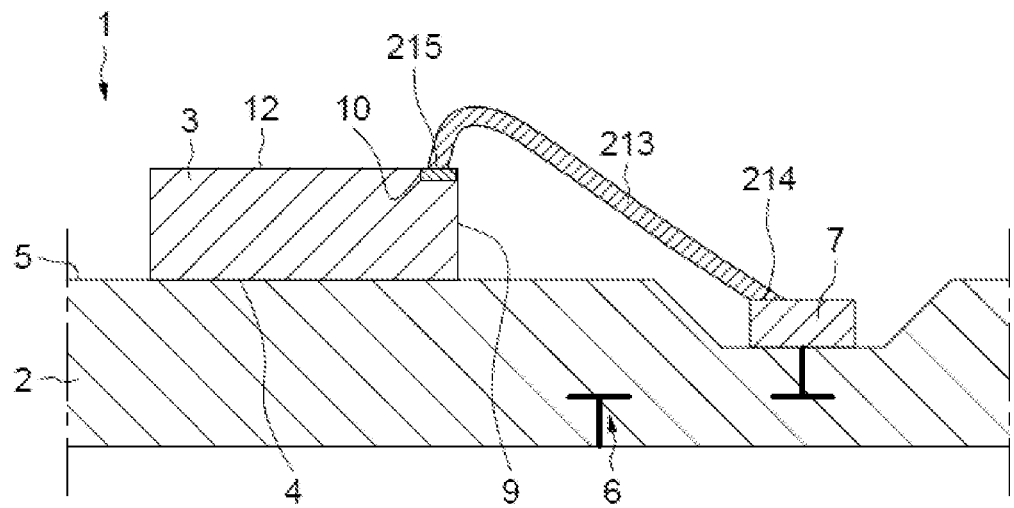
FIG. 13 represents a cross-sectional view of an electronic device during fabrication, in one step of fabrication.
Figure 14:
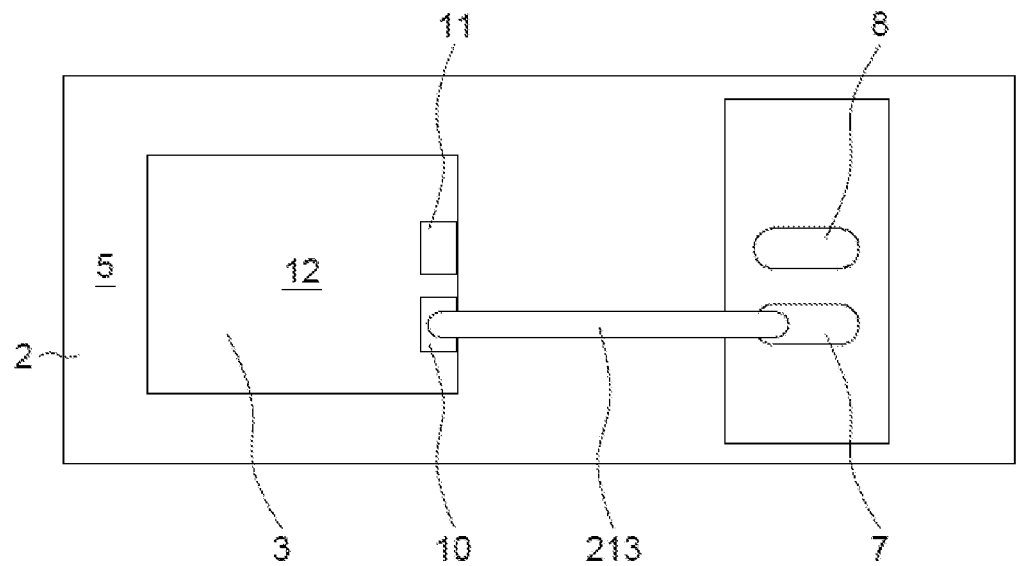
FIG. 14 represents a view from above of the electronic device of FIG. 13.

As illustrated in FIGS. 13 and 14, an electronic device 1 comprises a carrier substrate 2 and an electronic chip 3, including integrated circuits, a back face 4 of which is fixed to a front face 5 of the carrier substrate 2 by means of a layer of adhesive (not shown).

The carrier substrate 2 is made of a dielectric material and includes an integrated electrical connection network 6, for connecting to one or more metal levels, which comprises front exposed electrical connection pads 7 and 8 of the front face 5 which are located laterally at a distance from a flank 9 of the electronic chip 3 and in proximity of one another.

The electronic chip 3 comprises front exposed electrical connection pads 10 and 11 of a front face 12 of this electronic chip 3, opposite its back face 4, which are located at a distance from the flank 9 of the electronic chip 3, not far from the front pads 7 and 8 of the carrier substrate 2.

Steps for the purpose of forming electrical connections between the pads 7 and 10 and, optionally, the pads 8 and 11, of the carrier substrate 2 and of the electronic chip 3, respectively, will now be described.

In a step illustrated in FIGS. 13 and 14, an electrical connection wire (also referred to as a bonding wire) 213 is put into place between the exposed electrical connection pads 7 and 10 and electrical junctions 214 and 215 are formed, by means of soldering, between the ends of the electrical connection wire 213 and the pads 7 and 10, respectively.

This operation of putting the electrical connection wire 213 into place may be carried out using a specialized wire-bonding machine.

Figure 15:
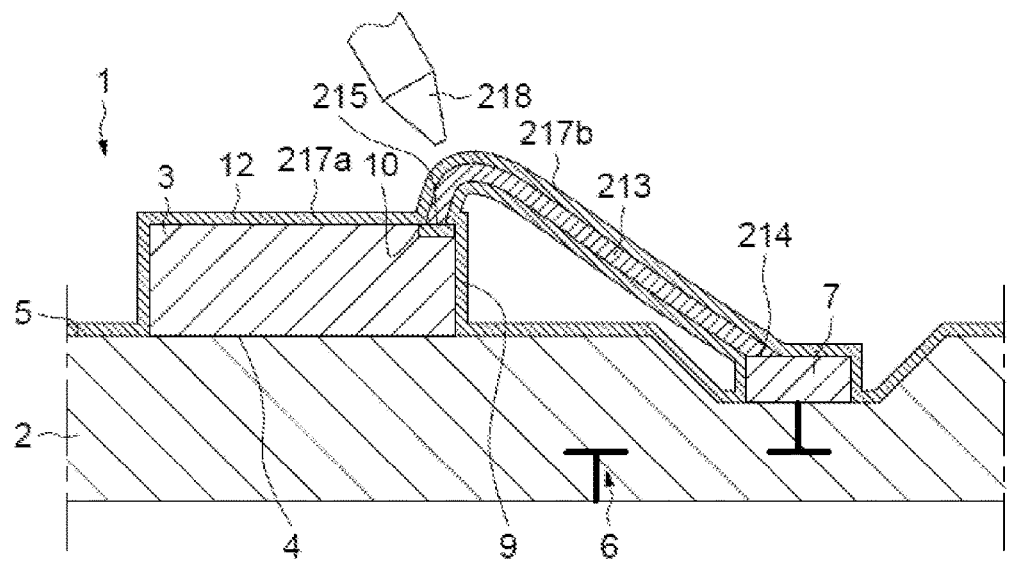
FIG. 15 represents a cross-sectional view of the electronic device during fabrication, in a later step of fabrication.
Figure 16:
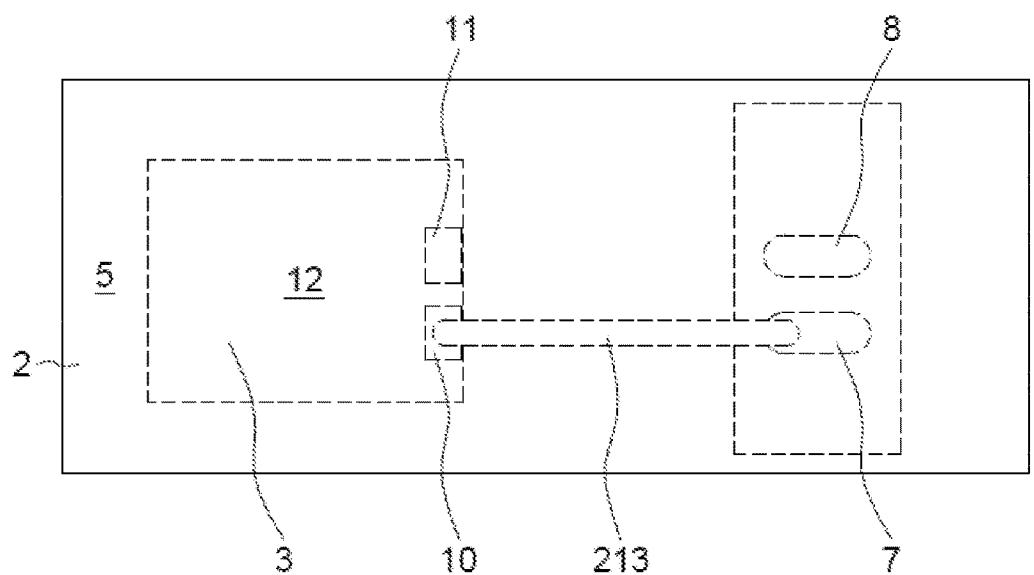
FIG. 16 represents a view from above of the electronic device of FIG. 15.

In a later step illustrated in FIGS. 15 and 16, a determined amount of an adhesive liquid dielectric material is distributed on top of a zone of the front faces 5 and 12 of the carrier substrate 2, of the electronic chip 3 and of the electrical connection wire 213, such that this dielectric material at least partially covers the faces 5 and 12, the pads 7, 8, 10 and 12 and the junctions 214 and 215 and completely surrounds the electrical connection wire 213.

After hardening, this dielectric material forms a dielectric layer 217a on top of the front faces 5 and 12 of the carrier substrate 2 and of the electronic chip 3 and forms a local dielectric coating 217b that covers the pads 7, 8, 10 and 12 and the junctions 214 and 215 and surrounds the electrical connection wire 213, the dielectric layer 217a and the local dielectric coating 217b extending one another.

This operation may be carried out, for example, using a specialized tool comprising a controlled dispensing syringe 218, capable of delivering at least one respective calibrated drop of the liquid conductive material, this liquid conductive material flowing in particular by means of wetting or capillary effect. As a variant, this operation may be carried out by immersing the entire electronic device 1 in a bath of dielectric material. The dielectric material may alternatively be distributed by means of sputtering.

Next, the liquid dielectric material is hardened in order to form the dielectric coatings 217a and 217b, by virtue of its intrinsic hardening qualities at room temperature or by hardening under the effect of a heat source or a source of light radiation. For example, the dielectric material may be a suitable epoxy resin or else a poly-para-xylylene polymer, commonly referred to as parylene. In an embodiment, the dielectric coatings 217a and 217b have a substantially uniform coating thickness over the surfaces of the electrical connection wire 213, the pads 7 and 10, the chip 3 and the substrate 2.

Figure 17:
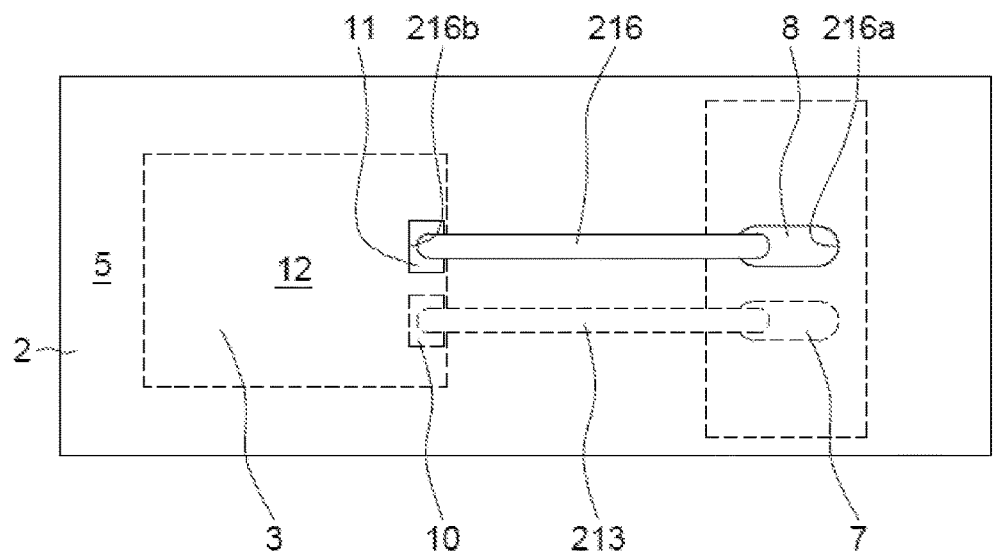
FIG. 17 represents a view from above of the electronic device during fabrication, in a later step of fabrication.

In a later step illustrated in FIG. 17, openings 216a and 216b are made through the dielectric layer 217a, for example by means of etching, above the pads 8 and 11. Next, an additional electrical connection wire (also referred to as a bonding wire) 216 is put into place between the additional exposed electrical connection pads 8 and 11 and electrical junctions are formed, by means of soldering, between the ends of the electrical connection wire 216 and the pads 8 and 11, respectively.

This operation of putting the electrical connection wire 216 into place may be carried out using a specialized wire-bonding machine.

Figure 18:
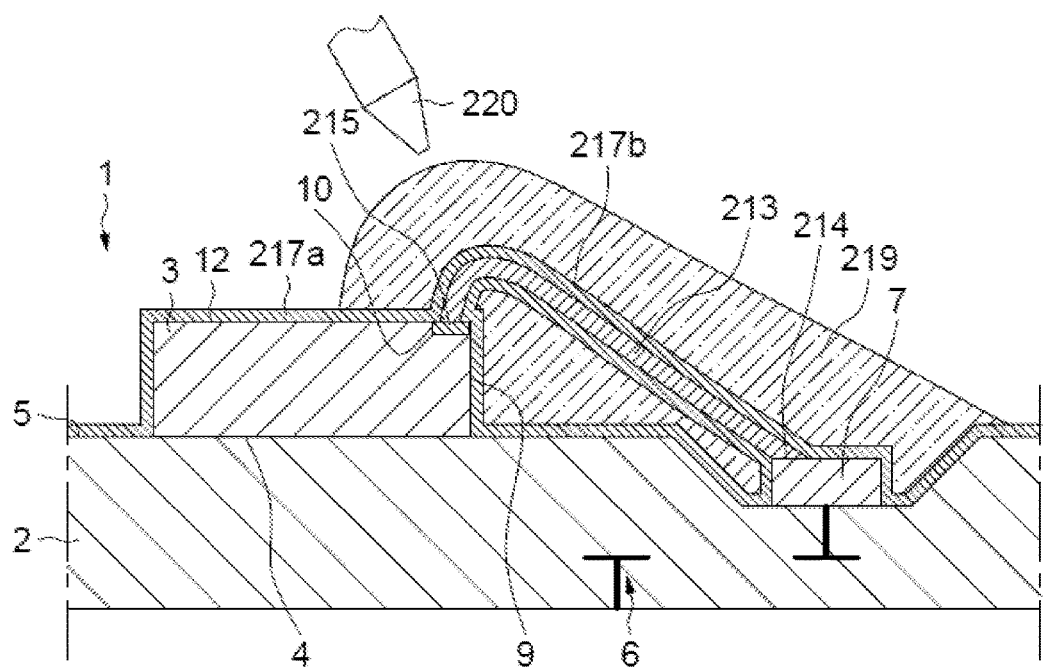
FIG. 18 represents a cross-sectional view of the electronic device during fabrication, in a later step of fabrication, showing the electronic device obtained.
Figure 19:
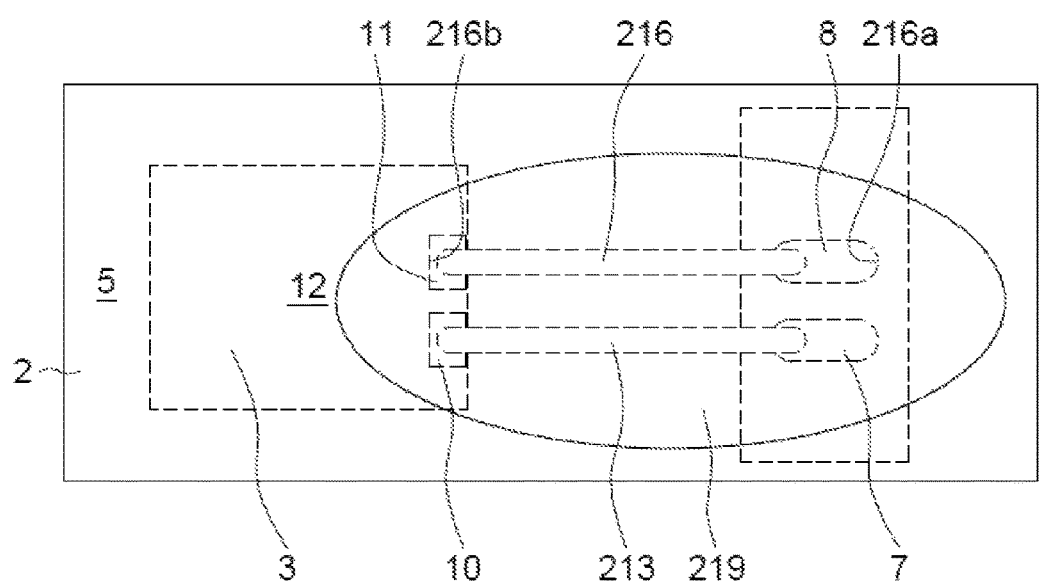
FIG. 19 represents a view from above of the electronic device of FIG. 18.

In a later step illustrated in FIGS. 18 and 19, a determined amount of an electrically conductive adhesive liquid material is locally distributed such that this conductive material completely surrounds the insulating coating 217b, covers the local dielectric coating 217a and makes contact with the electrical connection wire 216 and/or the pads 8 and 11, this conductive material potentially overflowing onto the front faces 5 and 12 of the carrier substrate 2 and of the electronic chip 3. After hardening, this conductive material forms a local electrically conductive shield 219 which is as close as possible to the electrical connection wire 213 and is connected to the electrical connection wire 216 and to the pads 8 and 11.

This operation may be carried out, for example, using a specialized controlled tool comprising a controlled dispensing syringe 220, capable of delivering at least one calibrated drop of the liquid conductive material, this liquid conductive material flowing in particular by means of wetting or capillary effect.

Next, the liquid conductive material is hardened in order to form the local conductive shield 219, by virtue of its intrinsic hardening qualities at room temperature or by hardening under the effect of a heat source or a source of light radiation. For example, the conductive material may be an epoxy resin filled with metal particles.

The finished electronic device 1 is then obtained.

The electrical connection wire 213 is intended to convey electrical signals between the pads 7 and 10 of the carrier substrate 2 and of the electronic chip 3. The conductive shield 219 forms electromagnetic protection for these electrical signals.

The pads 8 and 11, which are connected by the electrical connection wire 216, form ground pads of the electrical circuits of the electronic device 1. Thus, the conductive shield 219, which is connected to the pads 8 and 11 and to the electrical connection wire 216, is connected to the ground of the electrical circuits of the electronic device 1.

According to one variant embodiment, the local conductive shield 219 could partially cover the local dielectric coating 217b.

According to one variant embodiment, it would be possible to do away with the electrical connection wire 216.

Of course, the electronic device 1 may comprise other electrical connection wires 213 connected to other pads 7 and 10 of the carrier substrate 2 and of the electronic chip 3, and other electrical connection wires 216 connecting other pads 8 and 11 of the carrier substrate 2 and of the electronic chip 3, which are also equipped with local dielectric coatings 217b and local conductive shields 219, the respective steps of the production of which would be the same.

According to one variant embodiment, it would be possible for one local conductive shield 219 to be shared by multiple neighboring electrical connection wires 213 and to locally cover the front face 5 of the carrier substrate and/or the front face 12 of the electronic chip 3, such that this extended local conductive shield 219 would form electromagnetic protection for some of the electronic circuits of the electronic device 1. In this case, it would be possible to provide a single ground electrical connection wire 216.

According to one variant embodiment, the carrier substrate 2 could comprise a metal frame comprising a platform upon which the electronic chip 3 would be mounted, the electrical connection wires 213 and 216 connecting the electronic chip 3 to peripheral leads of this frame.

The invention claimed is:

1. An electronic device, comprising:
   a carrier substrate;
   an electronic chip mounted on the carrier substrate and including a first electrical connection pad and a second electrical connection pad;
   a first electrical connection wire connecting a first electrical connection pad of the carrier substrate and the first electrical connection pad of the electronic chip;
   a second electrical connection wire connecting a second electrical connection pad of the carrier substrate and the second electrical connection pad of the electronic chip;
   a dielectric layer made of a dielectric material on top of a zone of the electronic chip and of the carrier substrate, the dielectric layer covering the first electrical connection wire and the first electrical connection pads but not covering the second electrical connection wire and the second electrical connection pads, such that the dielectric layer forms a local dielectric coating which completely surrounds the first electrical connection wire and completely covers the first electrical connection pads; and
   a local conductive shield made of an electrically conductive material at least partially covering the local dielectric coating and directly contacting the second electrical connection wire and the second electrical connection pads.

2. The electronic device according to claim 1, wherein the local conductive shield completely covers the local dielectric coating, the second electrical connection wire and the second electrical connection pads.

3. An electronic device, comprising:
   a carrier substrate;
   an electronic chip mounted on the carrier substrate;
   a first electrical connection wire connecting between a first electrical connection pad at the carrier substrate and a second electrical connection pad at the electronic chip;
   a second electrical connection wire connecting between a third electrical connection pad at the carrier substrate and a fourth electrical connection pad at the electronic chip;
   a dielectric material which completely covers the first electrical connection wire, the first electrical connection pad and the second electrical connection pad but does cover any part of the second electrical connection wire, the third electrical connection pad and the fourth electrical connection pad; and
   an electrically conductive material that completely covers said dielectric material and is in physical and electrical contact with at least the second electrical connection wire.

4. The electronic device according to claim 3, wherein the electrically conductive material further completely covers the second electrical connection wire, the third electrical connection pad and the fourth electrical connection pad.

5. The electronic device according to claim 4, wherein the dielectric material has a non-uniform thickness along a length of the first electrical connection wire.

6. The device according to claim 1, wherein the dielectric layer has a non-uniform thickness along a length of the first electrical connection wire.

* * * * *